(12) United States Patent
Baird et al.

(10) Patent No.: US 6,593,542 B2
(45) Date of Patent: Jul. 15, 2003

(54) UV LASER SYSTEM AND METHOD FOR SINGLE PULSE SEVERING OF IC FUSES

(75) Inventors: Brian W. Baird, Oregon City, OR (US); Brady E. Nilsen, Beaverton, OR (US); Ho Wai Lo, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 09/903,439

(22) Filed: Jul. 11, 2001

(65) Prior Publication Data

US 2002/0005396 A1 Jan. 17, 2002

Related U.S. Application Data

(60) Provisional application No. 60/217,746, filed on Jul. 12, 2000.

(51) Int. Cl.[7] ............................................. B23K 26/38
(52) U.S. Cl. .............................. 219/121.68; 219/121.69
(58) Field of Search ........................ 219/121.68, 121.69, 219/121.73, 121.75, 121.77, 121.83; 438/132

(56) References Cited

U.S. PATENT DOCUMENTS

| | | | |
|---|---|---|---|
| 5,265,114 A | 11/1993 | Sun et al. ...................... 372/69 |
| 5,473,624 A | 12/1995 | Sun ............................... 372/69 |
| 5,559,338 A | 9/1996 | Elliott et al. ............... 250/492.1 |
| 5,670,068 A | 9/1997 | Kuriyama et al. ....... 219/121.68 |
| 5,811,751 A | 9/1998 | Leong et al. ............. 219/121.6 |
| 5,838,709 A | * 11/1998 | Owa |
| 5,864,430 A | * 1/1999 | Dickey et al. .......... 219/121.69 |
| 6,025,256 A | 2/2000 | Swenson et al. ............. 438/601 |
| 6,057,180 A | 5/2000 | Sun et al. .................... 438/132 |
| 6,172,325 B1 | 1/2001 | Baird et al. ............. 219/121.62 |
| 6,281,471 B1 | * 8/2001 | Smart ....................... 219/121.69 |
| 6,433,301 B1 | * 8/2002 | Dunsky et al. ......... 219/121.67 |

FOREIGN PATENT DOCUMENTS

| JP | 10-328872 | * 12/1998 |
| JP | 11090659 A | 4/1999 |
| WO | WO 00/73013 A1 | 7/2000 |

OTHER PUBLICATIONS

ESI 9800 Laser Semiconductor Processing System brochure (Feb. 2001).
ESI 9350 Memory Yield Improvement brochure (Jul. 1998).
ESI 9275 Laser Semiconductor Processing System brochure (Feb. 2001).

* cited by examiner

Primary Examiner—Geoffrey S. Evans
(74) Attorney, Agent, or Firm—Stoel Rives LLP

(57) ABSTRACT

A Q-switched, diode-pumped, solid-state (DPSS) laser (54) employs harmonic generation through nonlinear crystals (72) to generate UV light (74) for both link processing and target alignment. The type and geometry of the nonlinear crystals (72) are selected, and their temperatures are precisely controlled, to produce focused spot sizes with excellent beam quality for severing of IC fuses. A fraction of the laser output (56) can be utilized in a secondary target alignment system (50). An imaging optics module (52) may be employed to further enhance the shape quality of either or both of the secondary and primary beams. Each beam passes through a detection module (100) that measures the incident and reflected light. The two beams pass through a common combiner to facilitate calibration and alignment of the beams and subsequent link processing.

98 Claims, 5 Drawing Sheets

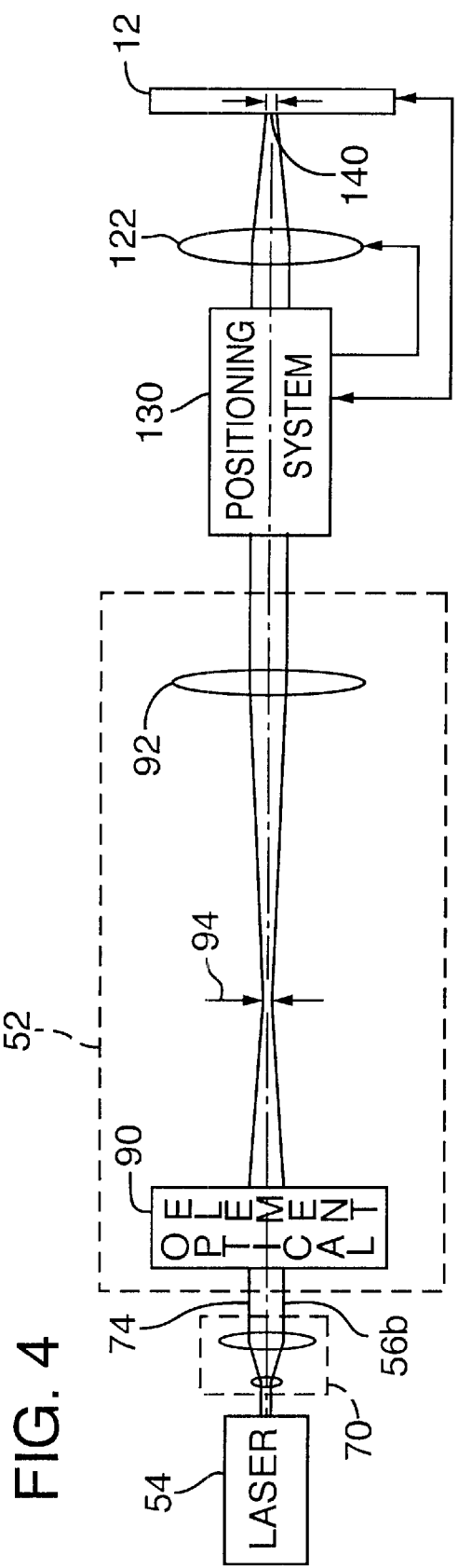

| Parameter/Crystal Type | LBO | BBO | CLBO |
|---|---|---|---|
| THG Type I d$_{eff}$(pm/V) | 1.12 | 2.06 | Not available |
| THG Type II d$_{eff}$(pm/V) | 1.01 | 1.42 | 0.94 |
| FHG Type I d$_{eff}$(pm/V) | Not available | 1.91 | 0.84 |
| FiHG Type I d$_{eff}$(pm/V) | Not available | 1.26 | 0.87 |
| THG Type I PM (degrees) | 38.1° ($\theta$=90°) | 31.3° | 39.1° |
| THG Type II PM (degrees) | 39.6° ($\phi$=90°) | 38.6° | 48.5° |
| FHG Type I PM (degrees) | Not available | 47.6° | 61.6° |
| FiHG Type I PM (degrees) | Not available | 51.1° | 67.3° |
| THG Type I PM Length (mm) | 5 - 20 | 3 - 12 | 5 - 20 |
| THG Type II PM Length (mm) | 5 - 20 | 3 - 12 | 5 - 20 |
| FHG Type I PM Length (mm) | Not available | 3 - 12 | 5 - 20 |
| FiHG Type I PM Length (mm) | Not available | 3 - 12 | 5 - 20 |
| THG Type I Walk-Off Angle (degrees) | 0.99 | 4.1 | Not available |
| THG Type II Walk-Off Angle (degrees) | 0.54 | 4.5 | 2.1 |
| FHG Type I Walk-Off Angle (degrees) | Not available | 4.8 | 1.83 |
| FiHG Type I Walk-Off Angle (degrees) | Not available | 5.3 | 1.69 |

PM=phase-matching angle and refers to crystal cut

FIG. 5

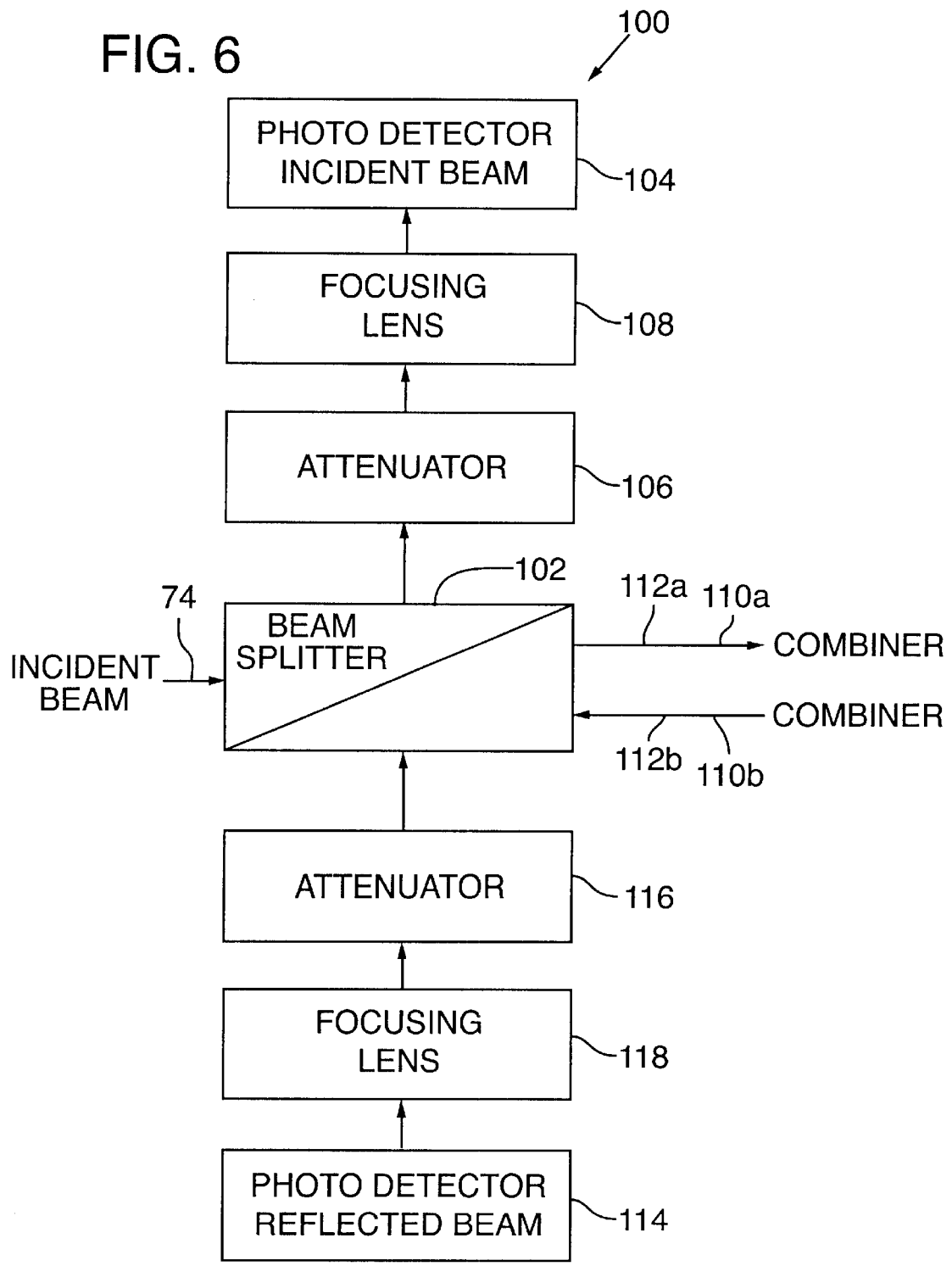

UV LASER SYSTEM AND METHOD FOR SINGLE PULSE SEVERING OF IC FUSES

RELATED APPLICATIONS

This patent application derives priority from U.S. Provisional Application No. 60/217,746, filed Jul. 12, 2000.

FEDERALLY SPONSORED RESEARCH OR DEVELOPMENT

Not applicable.

TECHNICAL FIELD

The present invention relates to a laser-based system or method for severing integrated circuit (IC) device fuses, and, in particular, to such a system or method that employs a single UV laser pulse to sever an IC fuse.

BACKGROUND OF THE INVENTION

FIGS. 1, 2A, and 2B show repetitive electronic circuits 10 of an IC device on a wafer or workpiece 12 that are commonly fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable circuit fuses or links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links to program logic products, gate arrays, or ASICs.

Links 22 are about 0.5–2 microns ($\mu$m) thick and are designed with conventional link widths 28 of about 0.8–2.5 $\mu$m, link lengths 30, and element-to-element pitches (center-to-center spacings) 32 of about 2–8 $\mu$m from adjacent circuit structures or elements 34, such as link structures 36. Although the most prevalent link materials have been polysilicon and like compositions, memory manufacturers have more recently adopted a variety of more conductive metallic link materials that may include, but are not limited to, aluminum, copper, gold nickel, titanium, tungsten, platinum, as well as other metals, metal alloys, metal nitrides such as titanium or tantalum nitride, metal silicides such as tungsten silicide, or other metal-like materials.

Traditional 1.047 $\mu$m or 1.064 $\mu$m infrared (IR) laser wavelengths have been employed for more than 20 years to explosively remove circuit links 22. Before link processing is initiated, circuits 10, circuit elements 14, or cells 20 are tested for defects, the locations of which may be mapped into a database or program that determines locations of links 22 to be processed. Typically, the same IR laser beam used for processing the links is used, at reduced intensity, to locate the position of the focused spot of the IR laser beam with respect to reflective alignment marks, such as metal on oxide, positioned at the corners of the dies and/or wafers supporting the electronic components.

Conventional memory link processing systems focus a single pulse of IR laser output having a pulse width of about 4 to 20 nanoseconds (ns) at each link 22. FIGS. 2A and 2B show a laser spot 38 of spot size diameter 40 impinging a link structure 36 composed of a polysilicon or metal link 22 positioned above a silicon substrate 42 and between component layers of a passivation layer stack including an overlying passivation layer 44 (shown in FIG. 2A but not in FIG. 2B), which is typically 2000–10,000 angstrom (A) thick, and an underlying passivation layer 46. Silicon substrate 42 absorbs a relatively small proportional quantity of IR radiation, and conventional passivation layers 44 and 46 such as silicon dioxide or silicon nitride are relatively transparent to IR radiation. FIG. 2C is a fragmentary cross-sectional side view of the link structure of FIG. 2B after the link 22 is removed by the prior art laser pulse. The quality of the crater formed in FIG. 2C is neither uniform nor predictable.

To avoid damage to the substrate 42 while maintaining sufficient energy to process a metal or nonmetal link 22, Sun et al. in U.S. Pat. No. 5,265,114 and U.S. Pat. No. 5,473,624 proposed using a single 9 to 25 ns pulse at a longer laser wavelength, such as 1.3 $\mu$m. to process memory links 22 on silicon wafers. At the 1.3 $\mu$m laser wavelength, the absorption contrast between the link material and silicon substrate 42 is much larger than that at the traditional 1 $\mu$m laser wavelengths. The much wider laser processing window and better processing quality afforded by this technique has been used in the industry for several years with great success.

The 1.0 $\mu$m and 1.3 $\mu$m laser wavelengths have disadvantages however. In general, the optical absorption of such IR laser beams 12 into a highly electrically conductive metallic link 22 is less than that of visible or UV beams; and the practical achievable spot size 38 of an IR laser beam for link severing is relatively large and limits the critical dimensions of link width 28, link length 30 between contacts 24, and link pitch 32. This conventional laser link processing relies on heating, melting, and evaporating link 22, and creating a mechanical stress build-up to explosively open overlying passivation layer 44.

The thermal-stress explosion behavior is also somewhat dependent on the width of link 22. As the link width becomes narrower than about 1 $\mu$m, the explosion pattern of passivation layers 44 becomes irregular and results in an inconsistent link processing quality that is unacceptable. Thus, the thermal-stress behavior limits the critical dimensions of links 22 and prevents greater circuit density.

U.S. Pat. No. 6,025,256 of Swenson et al. describes methods of using ultraviolet (UV) laser output to expose links that "open" the overlying passivation or resist material with low laser power through a different mechanism for material removal and provide the benefit of a smaller beam spot size. The links are subsequently etched.

U.S. Pat. No. 6,057,180 of Sun et al. describes methods of using UV laser output to remove links 22 positioned above a passivation layer of sufficient height to safeguard the underlying substrate from laser damage. This technique advocates modification of the target material and structure well in advance of laser processing.

Thus, improved link processing methods are still desirable.

SUMMARY OF THE INVENTION

An object of the present invention is, therefore, to provide a system or method that employs a single UV laser pulse to sever an IC fuse.

The present invention provides a Q-switched, diode-pumped, solid-state (DPSS) laser that employs harmonic generation through nonlinear crystals to generate green and/or IR and UV light. In a preferred embodiment, the type and geometry of the nonlinear crystals are selected to produce excellent beam quality suitable for subsequent beam shaping and focusing necessary to produce focused spot sizes that are advantageous for severing of IC fuses. The temperatures of the nonlinear crystals may also be precisely regulated using temperature feedback control loops to maintain advantageous phase matching conditions so as to produce uniform processing laser pulse characteristics. In addition, beam shape quality may also be enhanced by an imaged optics module capable of spatially filtering unwanted beam artifacts.

In a further preferred embodiment, because many standard alignment targets are difficult to detect with a UV laser beam, a fraction of the green or IR output may be utilized for the separate purpose of target alignment. The fractional green or IR target alignment beam follows a separate optical path with a separate set of optical elements and is attenuated to the proper power level. An imaged optics module for the fractional green or IR beam optimizes its shape for alignment scans. The green or IR alignment beam and the UV alignment beam pass through detection system modules and are separately aligned to a calibration target through a beam combiner common to both optical paths and their respective resulting reflected light is detected to calibrate the alignment beam with the UV link processing beam. The green or IR alignment beam can then be used to align the beam(s) to a given die, and the desired links on the die can be severed by the UV link processing beam without further calibration.

This invention provides the capability to produce high quality, focused spots that are smaller than conventionally used by IR link processing systems. The invention also provides improved UV pulse-to-pulse energy level stability while providing a means to deliver pulses at high repetition rates desired for improved throughput. This invention further provides a solution to the problem of aligning to alignment marks that have little contrast at the UV wavelength by using the green beam and/or IR beam, generated by the same source, as an alignment beam.

Additional objects and advantages of the invention will be apparent from the following detailed description of preferred embodiments thereof, which proceeds with reference to the accompanying drawings.

BRIEF DESCRIPTION OF THE DRAWINGS

FIG. 4 is a simplified partly schematic view of portions of the laser system of the present invention including details of one embodiment of an imaged optics module.

FIG. 5 is a table presenting parameters for preferred types of nonlinear crystals.

FIG. 6 is a simplified schematic view of a detection module.

DETAILED DESCRIPTION OF PREFERRED EMBODIMENTS

Figure 1:
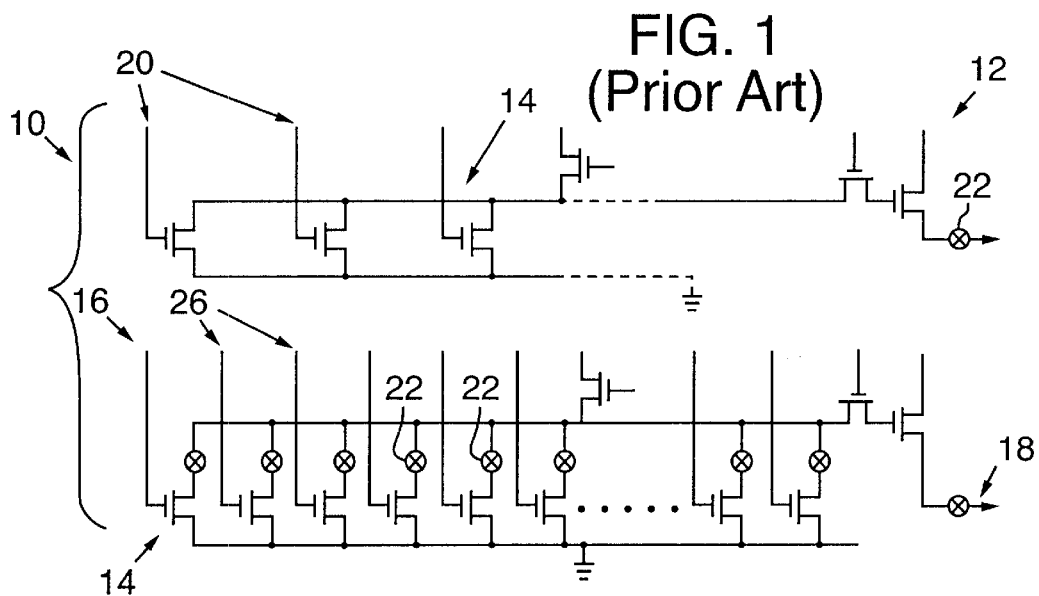
FIG. 1 is a schematic diagram of a portion of a DRAM showing the redundant layout of and programmable links in a spare row of generic circuit cells.
Figure 2A:
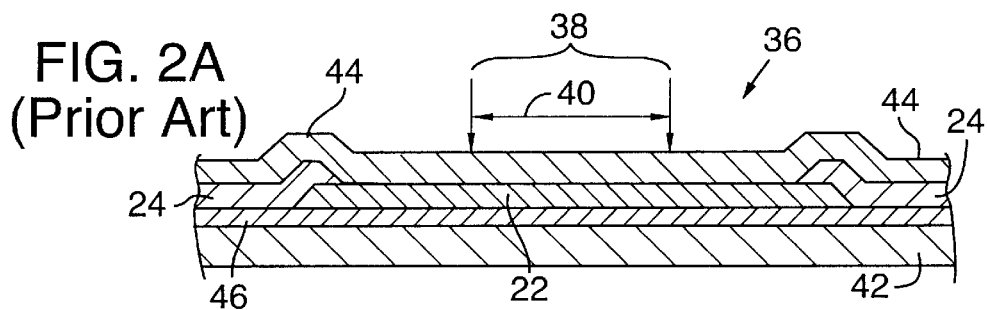
FIG. 2A is a fragmentary cross-sectional side view of a conventional, large semiconductor link structure receiving a laser pulse.
Figure 2B:
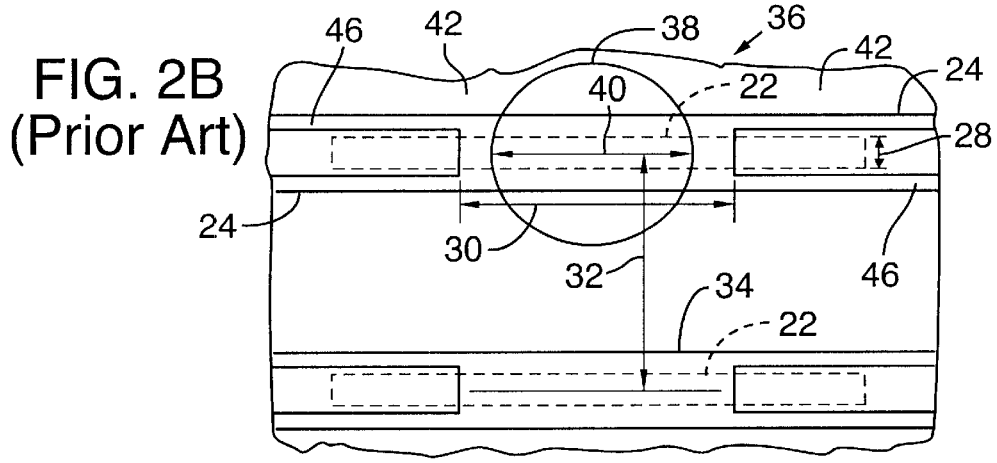
FIG. 2B is a fragmentary top view of the link structure and the laser pulse of FIG. 2A, together with an adjacent circuit structure.
Figure 2C:
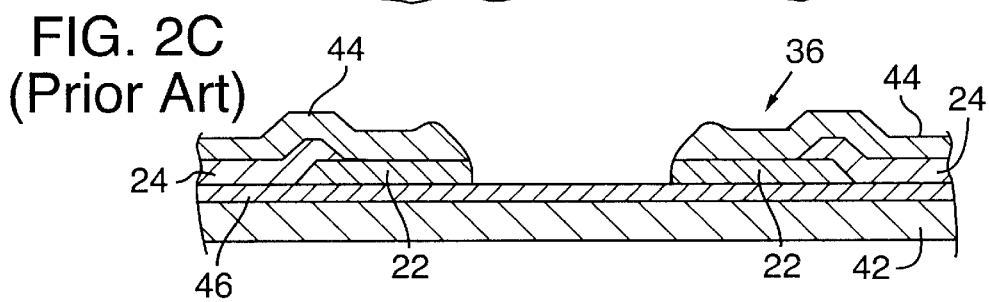
FIG. 2C is a fragmentary cross-sectional side view of the link structure of FIG. 2B after the link is removed by the laser pulse.
Figure 3:
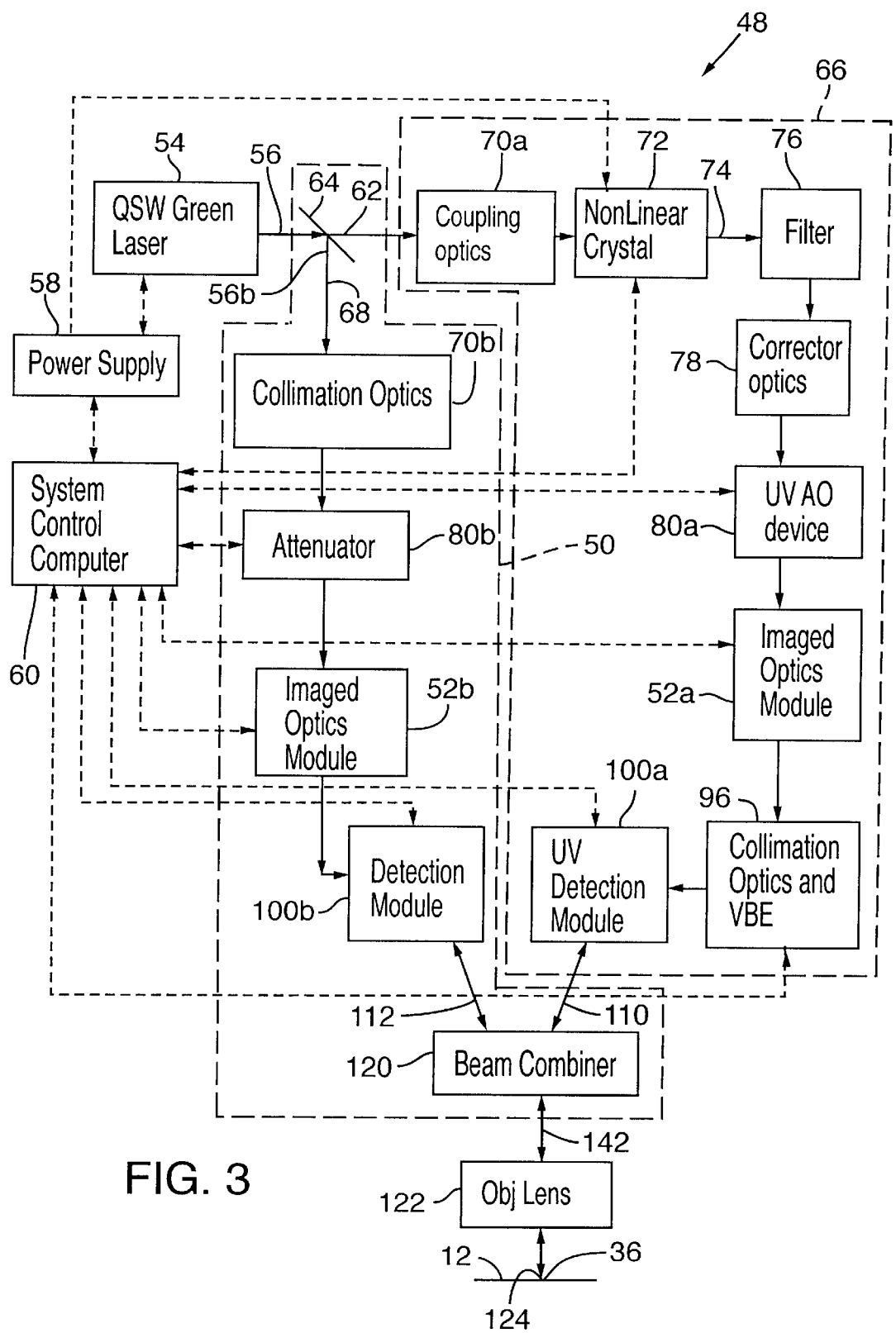
FIG. 3 is a schematic diagram of an embodiment of a laser system of the present invention including one or more alignment detection modules.

FIG. 3 shows certain components of a preferred embodiment of laser system 48 of the present invention and includes a secondary target alignment system 50. FIG. 4 shows certain additional or optional components of laser system 48 together with certain components of one embodiment of an imaged optics module 52 and with the secondary target alignment system (STAS) 50 optionally omitted. Also for convenience in FIG. 3, the beam paths are shown with solid line arrows, and the electrical or signal paths are shown with broken line arrows. Although most of the broken line arrows are shown pointing in both directions for convenience, skilled persons will appreciate that many of these signal paths can be implemented as open loops.

With reference to FIGS. 3 and 4, a preferred embodiment of a laser system 48 of the present invention includes a laser 54 that in general preferably provides a wavelength component that is shorter than 575 nm such as within a wavelength range of about 510–575 nm, which may herein after be referred to as green for convenience. However, a longer wavelength component within the IR region, preferably shorter than 1150 nm and more preferably within the range of 1020–1150 nm, may additionally be provided such that the longer wavelength is the first harmonic and the shorter (green) wavelength is the second harmonic. Laser 54 preferably includes a Q-switched, diode-pumped (DP), solid-state (SS) laser that preferably includes a solid-state lasant such as Nd:YAG, Nd:YLF, Nd:YAP, or most preferably Nd:YVO$_4$, that produces infrared light which is subsequently converted to green light via the nonlinear optical process of second harmonic generation. Such lasers 54 may provide harmonically generated laser pulses or output 56 with a wavelength component such as about 532 nm (frequency doubled Nd:YVO$_4$) or about 524 nm (frequency doubled Nd:YLF) with primarily a TEM$_{00}$ spatial mode profile. A power supply 58 provides the electrical power, RF power, and control signals to laser 54 and may be controlled by a system control computer 60.

Although Gaussian is used to describe the irradiance profile of laser output 56, skilled persons will appreciate that most lasers 54 do not emit perfect Gaussian output 56 having a value of M$^2$=1. For convenience, the term Gaussian is used herein to include profiles where M$^2$ is less than or equal to about 1.5, even though M$^2$ values of less than 1.3 or 1.2 are preferred. Skilled persons will appreciate that other wavelengths are available from the other listed lasants. Although laser cavity arrangements, harmonic generation, and Q-switch operation are all well known to persons skilled in the art, certain details of preferred embodiments will be presented herein.

Laser output 56 may optionally be passed through a variety of well-known expansion and/or collimation optics and propagates along a first optical path 62. When secondary target alignment system (STAS) 50 is employed, laser output 56 meets a beamsplitter 64 that transmits a major portion of the energy of laser output 56 through a UV target severing and alignment system (UV SAS) 66 along the first optical path 62 and deflects a fractional portion of the energy of laser output 56 through a STAS 50 along a second optical path 68.

The majority of laser output 56 traveling along the first optical path 62 is optically coupled, through collimation or coupling optics 70a, into a nonlinear crystal 72 to convert the first wavelength component(s) into UV light by the process of harmonic conversion. If, for example, laser output 56 contains generally only green light such as second harmonic light with a wavelength component at about 532 nm, then nonlinear crystal 72 provides wavelength converted output 74 such as fourth harmonic light at with a wavelength component at about 266 nm (frequency quadrupled Nd:YVO$_4$). Persons skilled in the art will recognize that the process of fourth harmonic conversion is not reliant on IR content in laser output 56. Skilled persons will also appreciate that for conversion to the third harmonic both green and IR light will be provided by laser 54 and passed by beamsplitter 64 such that nonlinear crystal 72 provides wavelength converted output 74 with a wavelength component at about 355 nm (frequency tripled Nd:YVO$_4$). Skilled persons will appreciate that many other wavelengths for output 74 are possible depending on the original wavelength (s) propagated by laser 54 and the number of nonlinear crystals 72. Skilled persons will also appreciate that in embodiments where the preferred lasers 54 employ harmonic conversion, nonlinear crystal 72 is the "second" nonlinear crystal and preferably produces fourth or third harmonic conversion as described above. Skilled person will further appreciate an additional nonlinear crystal may be employed to convert first and fourth harmonic wavelength light to a fifth harmonic wavelength such as 213 nm (frequency quintupled Nd:YVO$_4$).

Preferably, the geometry and type of at least the second nonlinear crystal 72 are chosen to produce excellent beam quality suitable for subsequent beam shaping and focusing necessary to produce focused spot sizes that are advantageous for severing of IC fuses or links 22. The geometry and type of this second nonlinear crystal 72 are simultaneously selected to provide adequate energy per pulse output suitable for severing IC fuses. In particular, the length of nonlinear crystal 72 positioned along the optical path is chosen to balance the effects of the combination of the acceptance angle and birefringence walk-off, which may cause diminishment of beam quality with increasing crystal length, and pulse energy output that typically increases with increasing crystal length. The length of nonlinear crystal 72 positioned along the first optical path 62 is greater than or equal to about 1 mm and less than about 20 mm. Preferably, the length of nonlinear crystal 72 positioned along the first optical path 62 is greater than or equal to about 3 mm and less than or equal to about 12 mm. More preferably, the length of nonlinear crystal 72 positioned along the first optical path 62 is greater than or equal to about 4 mm and less than or equal to about 8 mm. Most preferably, the length of nonlinear crystal 72 positioned along first optical path 62 is greater than or equal to about 6 mm and less than or equal to about 8 mm. Conventional CLBO nonlinear crystals are, for example, 12–15 mm in length along the axis of propagation to maximize the amount of laser light conversion. Positioning a shorter length of nonlinear crystal 72, such as less than about 7 mm, along the first optical path 62 is particularly desirable for fourth and fifth harmonic generation applications. Furthermore, skilled persons will appreciate that although the length of nonlinear crystal 72 positioned along the first optical path 62 is preferably collinear or parallel with the major axis of nonlinear crystal 72, nonlinear crystal 72 may be positioned such that its surfaces or axes are neither parallel with nor perpendicular to the first optical path 62 travelling through the nonlinear crystal 72. Although a conventionally large nonlinear crystal can be employed for third harmonic applications, such a crystal can also be employed for fourth or fifth harmonic applications where the first optical path 62 passes through only a short length, less than about 7–10 mm, of the crystal.

Depending on the type of nonlinear crystal 72 employed, the geometry of nonlinear crystal 72 may also be selected such that the dimensions transverse to the direction of beam propagation are chosen to be more generous than typically required strictly based on clear aperture considerations as routinely practiced by those skilled in the art. This transverse geometrical consideration provides for potential hygroscopic diminishment of the clear aperture and thereby maintains a sufficient area of the overall clear aperture during the useful life of nonlinear crystal 72. The other sides, i.e. height and width, of the nonlinear crystal 72 are typically 3–5 mm but may be larger, and the entire nonlinear crystal 72 is typically square or rectangular, but may be formed in other shapes as well.

Nonlinear crystal 72 is preferably fabricated from β-BaB$_2$O$_4$ (barium borate or BBO), LiB$_3$O$_5$ (lithium borate or LBO), or CsLiB$_6$O$_{10}$ (CLBO). BBO, LBO, and CLBO are all preferred for converting laser output 56 into the near UV (third harmonic generation), with LBO being most preferred. BBO and CLBO are both preferred for converting laser output 56 into the UV fourth harmonic or fifth harmonic generation, with CLBO being most preferred. LBO is preferred for second harmonic generation, but many other nonlinear crystals are known to skilled persons and could be employed. Skilled persons will appreciate that different harmonics may employ different cuts of nonlinear crystals 72 with respect to their crystallographic axes and different wavelength-dependent coatings. FIG. 5 is a table presenting parameters, including the lengths, for preferred types of nonlinear crystals. In FIG. 5, THG represents third harmonic generation; FHG represents fourth harmonic generation; FIHG represents fifth harmonic generation; PM represents phase-matching angle and may refer to crystal cut; and $d_{eff}$(pm/V) is a figure of merit representing the efficiency with which a nonlinear crystal is capable of converting fundamental wavelength light into higher harmonic light output.

In one particular embodiment, a BBO or CLBO nonlinear crystal 72 is employed to convert 532 nm laser output 56 into wavelength converted output 74 at about 266 nm laser light through the process of fourth harmonic conversion. A BBO nonlinear crystal 72 provides excellent conversion efficiency, maintains good beam quality in both the vertical and horizontal alignment axes, has a very good UV damage threshold, and is not as hygroscopic as some other common nonlinear crystals. BBO also has very good transmission at 266 nm. CLBO is, however, preferred even though it is more hygroscopic than BBO because CLBO offers a better acceptance angle and smaller walk off angle than BBO.

The temperatures of the nonlinear crystals 72 are precisely regulated, preferably using temperature feedback control loops, to maintain advantageous phase matching conditions so as to produce uniform processing laser pulse characteristics at the appropriate wavelengths. In particular, laser output alignment is sensitive to changes in the temperature of the nonlinear crystals 72, such that both beam position, quality, shape, and output power can be significantly affected by small temperature changes in the nonlinear crystals 72. A module containing nonlinear crystal 72 may receive its power for temperature regulation from power supply 58. The desired temperature may be preset and/or controlled directly or indirectly from system control computer 60 or a subprocessor. The temperature regulation improves both alignment and target processing and also helps to minimize collateral damage to nontarget areas.

Wavelength converted output 74 is then passed through a wavelength-selective filter 76 to block any unconverted output emitted from nonlinear crystal 72 from being further transmitted towards the subsequent components of UV SAS 66 and ultimately the workpiece 12. Although filter 76 could be omitted for applications in which a small degree of unconverted output may be of little significance to downstream components or to the link severance performance with respect to particular materials, filter 76 is preferably employed to block green and/or IR light from interacting with link structures 36 and from interfering with operation of UV detection module 100a. If filter 76 is omitted, downstream mirrors may be coated to preferably reflect UV light and transmit or dump the green and/or IR light.

In the preferred embodiment, wavelength converted output 74 is then transmitted through a set of corrector optics 78 which deliver a substantially round beam to an acousto optic modulator (AOM) 80a. In this preferred embodiment which is shown in FIG. 3, the laser output 56 is not modulated by a separate AOM, and AOM 80a is an ultraviolet AOM that follows corrector optics 78 to provide a more stable wavelength converted output 74 from nonlinear crystal 72. AOM 80a is used to transmit only the desired laser pulses of the wavelength converted output 74 to the work surface and attenuate the energy of desired individual pulses to a desired pulse energy value for either IC fuse severing or alignment scans. AOM 80a is capable of stitching between a high attenuation state to provide laser output power suitable for target alignment and a low attenuation state suitable for link processing. AOM 80a is also capable of completely blocking transmission of wavelength converted output 80a, particularly in a link processing autopulse mode. AOM 80a is further selected to transmit desired laser pulses without adversely affecting transmitted beam quality. UV grade AOMs 80a suitable for this application are commercially available. AOM 80a may be an electro-optic modulator (such as a Pockels cell) instead of an acousto-optic modulator. Alternatively, a polarization rotation element, such as a half wave plate or a liquid crystal cell, followed by a polarizer could be employed. AOMs 80a, their substitutes, and their uses are well known to persons skilled in the laser art.

Despite the substantially round profile of wavelength converted output 74 at this stage, there may be residual astigmatism or elliptical or other shape characteristics that are undesirable for an IC fuse severing process. Improved beam shape quality can be achieved with an optional imaged optics module 52a (generically 52) whereby unwanted beam artifacts are filtered spatially. For convenience, image optics module 52 shown in FIG. 4 is designated in FIG. 3 with 52a in UV SAS 66 and is designated with 52b in STAS 50.

Image optics module 52 preferably includes an optical element 90, a lens 92, and an aperture mask 94 placed at or near the beam waist created by the optical element 90 to block any undesirable side lobes and peripheral portions of the beam. In a preferred embodiment, optical element 90 is a focusing lens, and lens 92 is a collimating lens to add flexibility to the configuration of laser system 48. Varying the size of the aperture can control the edge sharpness of the spot profile to produce a smaller, sharper-edged intensity profile that should enhance the alignment accuracy. In addition, with this arrangement, the shape of the aperture can be precisely circular or also be changed to rectangular, elliptical, or other noncircular shapes that can be aligned parallel or perpendicular to the link length 30. The aperture of mask 94 may optionally be flared outwardly at its light exiting side.

In imaged optics module 52a, mask 94 may comprise a UV reflective or UV absorptive material, but is preferably made from a dielectric material such as UV grade fused silica or sapphire coated with a multilayer highly UV reflective coating or other UV resistant coating. Skilled persons will appreciate that aperture mask 94 can be used without optical elements 90 and 92.

In an alternative preferred embodiment, optical element 90 includes one or more beam shaping components that convert laser pulses having a raw Gaussian irradiance profile into shaped (and focused) pulses that have a near-uniform "top hat" profile, or particularly a super-Gaussian irradiance profile, in proximity to an aperture mask 94 downstream of optical element 90. Such beam shaping components may include aspheric optics or diffractive optics. In this embodiment, lens 92 comprises imaging optics useful for controlling beam size and divergence. Skilled persons will appreciate that a single imaging lens component or multiple lens components could be employed. Skilled persons will also appreciate that shaped laser output can be employed without using an aperture mask 94.

In one preferred embodiment, the beam shaping components include a diffractive optic element (DOE) that can perform complex beam shaping with high efficiency and accuracy. The beam shaping components not only transforms the Gaussian irradiance profile to a near-uniform irradiance profile, but they also focus the shaped output to a determinable or specified spot size. Although a single element DOE is preferred, skilled persons will appreciate that the DOE may include multiple separate elements such as the phase plate and transform elements disclosed in U.S. Pat. No. 5,864,430 of Dickey et al., which also discloses techniques for designing DOEs for the purpose of beam shaping. The shaping and imaging techniques discussed above are described in detail in International Publication No. WO 00/73013 published on Dec. 7, 2000. The relevant portions of the disclosure of corresponding U.S. patent application Ser. No. 09/580,396 of Dunsky et al., filed May 26, 2000 are herein incorporated by reference.

In general, any of the preferred embodiments could be employed for link severing. Although some of the embodiments offer substantial cost advantages, the flat top irradiance profile for wavelength converted output 74 achievable by shaping and imaging might be useful for preventing substrate damage at the center of the spot for certain varieties of link structure 36, particularly where the passivation layer 46 underlying the link 22 is particularly thin and sensitive to UV damage. The imaged shaped output can create a more uniform crater because the uniform shape of wavelength converted output virtually eliminates the possibility of creating a hot spot at the center. Imaged shaping may therefore facilitate the formation of craters with a very flat and uniform bottom in addition to very precisely shaped geometries and crisp edges.

Moreover, a high fraction of the beam energy can be delivered to workpiece 12 without a large difference in fluence between the center and edges of the imaged spot. In addition, the flat top irradiance profile may be desired to maximize the energy per pulse that propagates through aperture mask 94 and therefore minimize the energy clipped or wasted by the size limit of the aperture. This approach may be of particular use for UV applications where the power of wavelength converted output 74 is low.

Skilled persons will also appreciate that the techniques described herein also permit enhanced repeatability and alignment accuracy. Because the dimensions and positions of the processed craters can be accurately predicted, such as in the center of links 22, and can be made to have a narrower profile than conventional link severing craters, these techniques may be useful for increasing the circuit density of the electronic workpieces 12.

With reference again to FIG. 3, wavelength converted output 74 preferably travels through a variable beam expander (VBE) 96 to allow a user to control the spot size of the beam. VBE 96 is positioned downstream of AOM 80a and preferably downstream of imaged optics module 52a, if it is employed. In a preferred embodiment, VBE 96 is motorized and allows individual lens elements to be commanded by the system control computer 60 to move to programmed positions, thus enabling computer control of the focused (shaped) spot size at the work surface. In a preferred arrangement, a pair of rotatable plates of glass to make small translational adjustments to the beam may additionally be employed. The rotatable plates are preferably positioned between VBE 96 and detection module 100a, but can alternatively be positioned between detection module 100a and beam combiner 120. The alignment adjustments for these plates can be manually performed, or their positions can be remotely controlled by the system control computer 60.

Continuing through UV SAS 66, wavelength converted output 74 is preferably directed through a UV detection module 100a. FIG. 6 is a simplified schematic view of a preferred detection module 100 (generic for detection modules 100a and 100b). For convenience, the detection module 100 shown in FIG. 6 is designated, in FIG. 3, with 100a in UV SAS 66 and with 100b in STAS 50.

Detection module 100 preferably includes a beamsplitter 102 that splits off a fraction of the incident wavelength converted output 74 so that it can be sampled. This incident beam may be split again, as desired, so that different types of sensors 104 can sample it. Preferably, detection module 100 includes a sensor 104 that is used to measure the incident beam during an alignment operation. Also in particular, detection module 100a preferably includes a sensor 104(a) that can characterize the pulsed output characteristics that are important for a severing operation. Turn mirrors are used to direct the incident beam onto sensors 104, through attenuates 106 and focusing lenses 108 as needed. Beamsplitter 102 preferably passes the major portion of wavelength converted output 74 along beam path 110a, shown in FIG. 6 and generally represented as beam path 110 in FIG. 3.

Beamsplitter 102 of detection module 100 is also preferably used to direct light that is reflected from the work surface to a reflection sensor 114. The reflected light is designated as beam path 110b in FIG. 6 for convenience, and is generically represented by beam path 110 in FIG. 3. Reflection sensor 114 measures the reflected beam during an alignment operation. Turn mirrors are used to direct the incident beam onto sensors 114, through attenuators 116 and focusing lenses 118 as needed. Sensor electronics for sensors 104 and 114 preferably communicate with system control computer 60.

The major portion of wavelength converted output 74 is then preferably directed through a beam combiner 120 if STAS 50 is employed. Beam combiner 120 preferably employs a dichroic mirror and directs wavelength converted output 74 through objective lens 122 toward a desired laser target position 124 on the workpiece 12. Skilled persons will appreciate that other implementations of beam combiner 120 are possible. Objective lens 122 can also be referred to as a "second imaging," focusing, cutting, or scan lens. A variety of positioning systems that move the workpiece 12 and/or objective lens and/or beam 142 are known to skilled practitioners and could be employed. A Model 9800 positioning system made by Electro Scientific Industries, Inc. of Portland, Oreg. can be modified to implement a preferred embodiment of the invention.

Preferably, the laser control system 60 directs the movement of components of a beam positioning system 130 and preferably synchronizes the firing of laser 54 to the motion of the components of beam positioning system 130 such as described in U.S. Pat. No. 6,172,325 ('325 Patent) of Baird et al., which describes laser processing power output stabilization techniques employing processing position feedback that improve pulse to pulse peak energy level stability while providing a means to deliver pulses at high repetition rates.

During a link processing operation, a Q-switched solid state laser 54 operates in cooperation with a pulse processing control system that employs an autopulse mode and a pulse-on-position mode to stabilize the pulse-to-pulse laser energy delivered to target locations on a workpiece 12 that is moved by beam positioning system 130. In the autopulse mode, laser pulses are emitted at a near maximum PRF, but the pulses are blocked from reaching the workpiece 12 by AOM 80a or an additional AOM within laser 54 or along the first optical path 62. In the pulse-on-position mode, the laser 54 emits a pulse each time the positioning system 130 moves a workpiece location through coordinates that coincide with a commanded laser beam coordinate. The processing control system moves the positioning system 130 at a near constant velocity that causes triggering of the laser 54 at about the maximum PRF in response to the workpiece 12 passing through a regularly spaced apart set of commanded laser beam coordinates. The pulse processing control system sets the AOM 80a to a transmissive state whenever a location to be processed is commanded and sets the AOM 80a to a blocking state whenever a location not to be processed is commanded. The pulse-to-pulse energy level stability of laser system 48 directly depends on the pulse-to-pulse energy level stability of laser 54. To meet this requirement, the interpulse period between emitted laser pulses is made substantially equal, thereby stabilizing its pulse-to-pulse energy level at the near maximum PRF. This pulse-to-pulse energy level stability reduces thermal and radiant effects that would otherwise be caused by laser duty cycle variations arising from firing IR laser at varying interpulse periods. Such thermal and radiant effects can include changes to the refractive indices of nonlinear crystals 72, thereby modifying the phase-matching conditions for harmonic generation, which causes large variations in the harmonic output energy. Such thermal and radiant effects can also cause the energy per pulse of laser 54 to vary which will then cause the output of laser system 48 to fluctuate.

For link processing, laser system 48 is capable of producing laser system output 140 having preferred parameters of link processing windows that may include programmable energy per pulse values in a range of about 0.01 $\mu$J to about 10 $\mu$J; spot size diameters or spatial major axes of about 0.3 $\mu$m to about 10 $\mu$m, and preferably from about 0.5–5.0 $\mu$m, and most preferably less than 2 $\mu$m; and a pulse repetition frequency (PRF) of greater than about 1 kHz, preferably greater than about 20 kHz or even as high as or higher than 100 kHz; an ultraviolet wavelength, preferably between about 180–390 nm; and temporal pulse widths that are shorter than about 100 ns, and preferably from about 4–20 ns or shorter. The preferred link processing parameters of laser system output 140 are selected in an attempt to circumvent damage to the underlying substrate 42 or surrounding structures 36.

When employing UV SAS 66 for target alignment, AOM 80a is used to attenuate wavelength converted output 74 to produce laser system output 140 having preferred parameters that may include spot size and pulse width parameters similar to those used for link severing. The attenuated pulses of wavelength converted output 74 are preferably generated at a PRF of about 20–100 kHz and have an output power of about 0.01 mW to about 1 mW. Typically the attenuated pulses have less than 5% of the energy of the link severing pulses for a given target alignment structure, but numerous factors including the reflectivity and other characteristics of the materials in these structures or link structures 36 will determine the best process windows for severing pulses and for alignment pulses for the particular target.

With reference again to FIG. 3, laser output 56, beam splitter 64, and second optical path 68, when a STAS 50 is employed, the deflected lower irradiance portion of laser output 56, laser output 56*b*, travels along the second optical path 68 and preferably passes through expansion and/or collimation optics 70*b*. Laser output 56*b* preferably contains green or IR light having an optical profile preferably optimized for purpose of target alignment.

Laser output 56*b* is then preferably directed through an attenuator 80*b* that is used to control the power of laser output 56*b* used for alignment scans. Attenuator 80*b* is preferably also used to stop laser output 56*b* from being transmitted to a target during UV alignment scans or UV link processing. Attenuator 80*b* may be the same or different type of device used for AOM 80*a*, but is preferably adapted for use with green and/or IR laser light. Attenuators 80*b* suitable for this application at these wavelengths are also commercially available. Attenuator 80*b* may alternatively be any one of the many types of laser shutters known to skilled practitioners.

Laser output 56*b* may optionally be passed through an imaged optics module 52*b* to optimize accuracy in the alignment process. Imaged optics module 52*b* may include the same or different components than imaged optics module 52*a*, but is preferably adapted for use with green and/or IR laser light. For example, image optics module 52*b* may not include a beam shaping element while imaged optics module 52*a* does include one. In addition, it may be desirable to have an aperture of a different shape and/or size in the aperture mask 94 in module 52*b* than those of the aperture mask 94 in module 52*a*. In a preferred embodiment, laser system 48 includes both an imaged optics module 52*a* and an imaged optics module 52*b*, and both imaged optics modules include a focusing lens and an aperture mask 94.

Laser output 56*b* is then directed toward a secondary detection module 100*b*, which is similar to detection module 100*a*, but secondary detection module 100*b* is adapted for use with green and/or IR laser light. Detection module 100*b* preferably includes a beamsplitter 102 that splits off a fraction of the incident laser output 56*b* so that it can be sampled. This incident beam may be split again, as desired, so that different types of sensors 104 can sample it. Preferably, detection module 100 includes a sensor 104 that is used to measure the incident beam during an alignment operation. Turn mirrors are used to direct the incident beam onto sensors 104, through attenuators 106 and focusing lenses 108 as needed. Beamsplitter 102 preferably passes a portion of laser output 56*b* along beam path 112*a*, shown in FIG. 6 and generically represented as beam path 112 in FIG. 3.

Beamsplitter 102 of detection module 100*b* is also preferably used to direct light that is reflected from the work surface to a reflection sensor 114. The reflected light is designated as beam path 112*b* in FIG. 6 for convenience, and is generically represented by beam path 112 in FIG. 3. Reflection sensor 114 measures the reflected beam during an alignment operation. Turn mirrors are used to direct the incident beam onto sensors 114, through attenuators 116 and focusing lenses 118 as needed. Sensor electronics for sensors 104 and 114 preferably communicate with system control computer 60.

The remaining portion of laser output 56*b* is preferably directed by beam splitter 102 through the beam combiner 120 and then through objective lens 122 toward the desired laser target position 124 on the workpiece 12. Laser output 56*b* preferably supplies about 0.01 mW to about 10 mW at about 20–100 kHz. When STAS 50 employs a green alignment beam, the laser spot size is preferably about 0.8 µm to about 5 µm. When STAS 50 employs an IR alignment beam, the laser spot size is preferably about 1.5 µm to about 5 µm.

When STAS 50 is employed, beam combiner 120 directs wavelength converted output 74 and laser output 56*b* so that they follow the same beam path 142 through the objective lens 122. Both beams can be aligned to the objective lens 122 using turning mirrors. The objective lens 122 is capable of focusing the wavelength converted output 74 to a spot size diameter of preferably less than about 2 µm and more preferably less than about 1.0 µm. If there is displacement between the focused wavelength converted output 74 and the focused laser output 56*b*, this displacement is calibrated out by scanning a target that possesses good reflection contrast at both wavelengths. A preferred alignment target suitable for scan by both wavelengths may contain chrome on a quartz grid. Such a calibration offset can then employed by the system control computer 60 to accurately target the focused spot of wavelength converted output onto IC links 22 to be severed.

In one embodiment, laser output 56 includes large quantities of both green (second harmonic) and IR (first harmonic) laser light; wavelength converted output 74 includes primarily UV (third, fourth, or fifth harmonic) laser light, preferably third harmonic light; and laser output 56*b* includes green or IR light for secondary target alignment. In this embodiment, an additional wavelength-selective filter can be introduced along the second optical path to exclude either the green or IR wavelength as desired.

In preferred embodiment, laser output 56 includes primarily green (second harmonic) laser light; wavelength converted output 74 includes primarily UV (fourth harmonic) laser light; and laser output 56*b* includes primarily green laser light for secondary target alignment. Since green light is closer than IR light in wavelength to the wavelength converted output 74, green light is currently preferred for secondary target alignment because the objective lens 122 is preferentially corrected in favor of wavelength converted output 74 over laser output 56*b*. The use of STAS 50 provides a solution to the problem of aligning to alignment marks that have little contrast at the UV wavelength, for example.

A wafer or workpiece 12 is typically pre-aligned by a wafer handler and a vision system so that the wafer is placed on a platform and oriented such that a feature of the wafer edge is positioned relative to a known coordinate system. The wafer is also roughly positioned so that the die (or group of die) to be processed are located under the objective lens 122. Once the proper die is located, additional link targeting accuracy can be accomplished by doing an additional alignment step using features of laser system 48.

A common method is to use an attenuated process laser beam to scan reference alignment marks or features that are located in the corners of each die. Scanning these marks teaches the positioning system 130 the location (X, Y, & Z coordinates) of the laser system output 140 with respect to the alignment marks. The scans are preferably performed with the laser 54 at a repetition rate of greater than 20 kHz, and the scan of each alignment target is typically conducted for about 0.01–10 milliseconds. Alternatively, scans can be performed in CW mode where laser 54 has sufficient output power. Once the beam positioning system 130 has been taught the precise location of the beam with respect to a given die, positioning system 130 can very accurately move the wafer and/or objective lens 122 and/or beam 142 to process the desired links 22 within the given die without further target alignment procedures. A laser system 48 can perform this operation without STAS 50 when the alignment targets are readily identified with UV light.

Use of the wavelength of laser output 56b (secondary beam) of STAS 50 for secondary beam alignment is particularly advantageous for applications where the alignment targets are not readily discernable with UV light of wavelength converted output 74 (primary beam). To facilitate use of STAS 50, a primary to secondary beam calibration step is preferably used to calibrate the alignment between wavelength converted output 74 and laser output 56b along optical path(s) 142. A calibration target, such as a chrome on quartz calibration grid, that can be scanned by both the primary and secondary laser beams is placed on the wafer platform. Sequential scans of the primary and the secondary laser beams are conducted across each desired calibration target so that the beam positioning system 130 is taught the relative locations of each beam. Alternatively, all the desired calibration targets are scanned by one beam first and then they are all scanned by the other beam. Any positional offset between the primary and secondary laser beams is then known and beam positioning instructions can be calibrated. The calibration target can then be removed from the wafer platform.

A wafer can then be processed using the secondary beam for the laser beam scanning alignment step with respect to each die. As the beam positioning system 130 moves the wafer and/or objective lens 122 and/or beam 142 from the alignment mark to the link 22 and/or links 22 to be severed, the offset between the primary and secondary beams is taken into account so that the primary beam impinges the link 22.

It will be obvious to those having skill in the art that many changes may be made to the details of the above-described embodiments of this invention without departing from the underlying principles thereof. The scope of the present invention should, therefore, be determined only by the following claims.

What is claimed is:

1. A laser system for processing links of an IC device, comprising:
   a laser source for generating green laser light having a wavelength within a wavelength range of about 510–575 nm for propagation along a first optical path;
   a nonlinear crystal positioned along the first optical path such that the nonlinear crystal converts a portion of the green laser light into UV light;
   a beam modulator, positioned along the first optical path, capable of switching between a high attenuation state to provide low laser system output power suitable for alignment to a target and a low attenuation state to provide high laser system output power suitable for link processing; and
   a UV light detection module positioned along the first optical path and downstream from the beam modulator, the UV detection module being adapted for detecting UV light reflected from the target.

2. The laser system of claim 1 further comprising:
   a beamsplitter positioned along the first optical path to receive the green laser light;
   a second optical path for propagating a portion of the green laser light received by the beamsplitter;
   a green light detection module positioned along the second optical path and downstream from the beamsplitter, the green light detection module being adapted for detecting green light reflected from a target; and
   a beam combiner positioned to receive UV laser light from the first optical path and green laser light from the second optical path and to transmit both green and UV laser light toward the target.

3. The laser system of claim 2 further comprising:
   a focusing optical element positioned along the second optical path, between the beam modulator and the green detection module, for focusing the green laser light; and
   an aperture mask positioned along the second optical path, between the focusing optical element and the green detection module, for clipping a peripheral portion of the green laser light.

4. The laser system of claim 3 in which the first optical path passes through greater than or equal to about 3 mm and less than or equal to about 12 mm of the nonlinear crystal.

5. The laser system of claim 3 in which the aperture mask has a noncircular aperture.

6. The laser system of claim 2 in which the beam modulator is also capable of switching to a full attenuation state to block transmission of laser system output in an autopulse mode.

7. The laser system of claim 1 in which the laser source also generates first harmonic IR laser light and the green light comprises the second harmonic such that the nonlinear crystal converts portions of the green laser light and the IR laser light into third harmonic UV laser light, and the UV detection module is adapted for detecting third harmonic UV light reflected from the target.

8. The laser system of claim 7 in which the laser source also generates IR laser light, further comprising:
   a beamsplitter positioned along the first optical path to receive the IR laser light;
   a second optical path for propagating a portion of the IR laser light received by the beamsplitter;
   an IR light detection module positioned along the second optical path and downstream from the beamsplitter, the IR light detection module being adapted for detecting IR light reflected from a target; and
   a beam combiner positioned to receive UV laser light from the first optical path and IR laser light from the second optical path and to transmit both IR and UV laser light toward the target.

9. The laser system of claim 7 in which the nonlinear crystal comprises BBO, LBO, or CLBO.

10. The laser system of claim 1 in which the laser source also generates IR laser light, further comprising:
    a beamsplitter positioned along the first optical path to receive the IR laser light;
    a second optical path for propagating a portion of the IR laser light received by the beamsplitter;
    an IR light detection module positioned along the second optical path and downstream from the beamsplitter, the IR light detection module being adapted for detecting IR light reflected from a target; and
    a beam combiner positioned to receive UV laser light from the first optical path and IR laser light from the second optical path and to transmit both IR and UV laser light toward the target.

11. The laser system of claim 10 further comprising:
a focusing optical element positioned along the second optical path, between the beam modulator and the IR detection module, for focusing the IR laser light; and
an aperture mask positioned along the second optical path, between the focusing optical element and the IR detection module, for clipping a peripheral portion of the IR laser light.

12. The laser system of claim 10 in which the nonlinear crystal comprises LBO.

13. The laser system of claim 1 in which the laser source also generates first harmonic IR laser light and the green light comprises the second harmonic such that the nonlinear crystal converts portions of the green laser light into fourth harmonic UV laser light, and the UV detection module is adapted for detecting fourth harmonic UV light reflected from the target.

14. The laser system of claim 13 in which the first optical path passes through greater than or equal to about 3 mm and less than or equal to about 12 mm of the nonlinear crystal.

15. The laser system of claim 14 in which the beam modulator is also capable of switching to a full attenuation state to block transmission of laser system output in an autopulse mode.

16. The laser system of claim 14 in which the nonlinear crystal comprises BBO, LBO, or CLBO.

17. The laser system of claim 13 in which the nonlinear crystal comprises CLBO.

18. The laser system of claim 13 in which the beam modulator is also capable of switching to a full attenuation state to block transmission of laser system output in an autopulse mode.

19. The laser system of claim 1 further comprising:
a focusing optical element positioned along the first optical path, between the beam modulator and the UV detection module, for focusing the UV laser light; and
an aperture mask positioned along the first optical path, between the focusing optical element and the UV detection module, for clipping a peripheral portion of the UV laser light.

20. The laser system of claim 19 in the first optical path passes through greater than or equal to about 3 mm and less than or equal to about 12 mm of the nonlinear crystal.

21. The laser system of claim 20 in which the nonlinear crystal comprises BBO, LBO, or CLBO.

22. The laser system of claim 19 in which the nonlinear crystal comprises BBO, LBO, or CLBO.

23. The laser system of claim 19 in which the aperture mask has a noncircular aperture.

24. The laser system of claim 19 in which the beam modulator is also capable of switching to a full attenuation state to block transmission of laser system output in an autopulse mode.

25. The laser system of claim 1 further comprising:
a diffractive optical element positioned along the first optical path, between the beam modulator and the UV detection module, for shaping the UV light; and
an aperture mask positioned along the first optical path, between the diffractive optical element and the UV detection module, for clipping a peripheral portion of the UV light.

26. The laser system of claim 25 in which the first optical path passes through greater than or equal to about 3 mm and less than or equal to about 12 mm of the nonlinear crystal.

27. The laser system of claim 25 in which the nonlinear crystal comprises BBO, LBO, or CLBO.

28. The laser system of claim 25 in which the aperture mask has a noncircular aperture.

29. The laser system of claim 25 in which the beam modulator is also capable of switching to a full attenuation state to block transmission of laser system output in an autopulse mode.

30. The laser system of claim 1 in which the first optical path passes through greater than or equal to about 1 mm and less than about 20 mm of the nonlinear crystal.

31. The laser system of claim 30 in which the nonlinear crystal comprises BBO, LBO, or CLBO.

32. The laser system of claim 1 in which the first optical path passes through greater than or equal to about 3 mm and less than or equal to about 12 mm of the nonlinear crystal.

33. The laser system of claim 32 in which the nonlinear crystal comprises BBO, LBO, or CLBO.

34. The laser system of claim 1 in which the first optical path passes through less than about 7 mm of the nonlinear crystal.

35. The laser system of claim 34 in which the nonlinear crystal comprises BBO, LBO, or CLBO.

36. The laser system of claim 1 in which the nonlinear crystal comprises BBO, LBO, or CLBO.

37. The laser system of claim 1 further comprising:
a wavelength selective filter positioned along the first optical path, between the nonlinear crystal and the UV detection module, to block green light from propagating downstream of the filter.

38. The laser system of claim 1 in which the beam modulator is also capable of switching to a full attenuation state to block transmission of laser system output in an autopulse mode.

39. A method for aligning a laser processing beam to a link of an IC device, comprising:
generating green laser light for propagation along a first optical path;
splitting the green laser light into a major portion and a lesser portion such that the major portion of the green laser light propagates along the first optical path and such that the lesser portion propagates along a second optical path;
employing a nonlinear crystal positioned along the first optical path to convert green laser light traveling along the first optical path to UV laser light;
causing beam modulation to impart a high attenuation state to the UV laser light to provide low power UV laser output;
directing low power UV laser output along the first optical path and through a beam combiner toward a target;
detecting UV light reflected from the target;
causing beam modulation to impart a full attenuation state to the UV laser light to block the transmission of UV laser light toward the target;
directing the lesser portion of the green laser light along the second optical path and through the beam combiner of the first optical path toward the target;
detecting green light reflected from the target; and
calibrating relative positions of the low power UV laser output and the lesser portion of grew laser light.

40. The method of claim 39 further employing a variable attenuator to cause changes in attenuation state to the lesser potion of the green laser light.

41. The method of claim 39, further comprising:
passing the lesser posion of the green laser light or the low power UV laser output through an imaged optics module.

42. The method of claim 41 in which the image optics module comprises an optical element and an aperture mask.

43. The method of claim 42 in which the optical element comprises a diffractive optics element.

44. The method of claim 42, further comprising:
directing low power UV laser output and/or green laser light toward workpiece feature or alignment target;
detecting UV and/or green laser light reflected from the workpiece feature or alignment target;
aligning an output position of the UV laser light to the link;
causing beam modulation to impart a low attenuation state to the UV laser light to provide high power laser output; and
directing a pulse of high power laser output toward the link to sever it.

45. The method of claim 44, in which a single beam modulator causes changes in attenuation state to the UV laser light.

46. The method of claim 41 in which the length of nonlinear crystal positioned along the first optical path is greater than or equal to about 3 mm and less than or equal to about 12 mm.

47. The method of claim 46 in which the UV laser light comprises a fourth or fifth harmonic wavelength.

48. The method of claim 39 in which the length of nonlinear crystal positioned along the first optical path is greater than or equal to about 3 mm and less than or equal to about 12 mm.

49. The method of claim 48 in which the length of nonlinear crystal positioned along the first optical path is greater than or equal to about 4 mm and less than or equal to about 8 mm.

50. The method of claim 49 in which the UV laser light comprises a fourth or fifth harmonic wavelength.

51. The method of claim 39, further comprising:
directing low power UV laser output and/or green laser light toward a workpiece feature or alignment target;
detecting UV and/or green laser light reflected from the workpiece feature or alignment target;
aligning an output position of the UV laser light to the link;
causing beam modulation to impart a low attenuation state to the UV laser light to provide high power laser output; and directing a pulse of high power laser output toward the link to sever it.

52. The method of claim 51 further comprising employing a variable attenuator to case changes in a attenuation state to he lesser portion of the green laser light.

53. The method of claim 51 further comprising:
aligning the output position of the UV laser light to a second link; and
directing a second pulse of high power laser output toward the second link to sever it before directing low power UV laser output and/or green laser light toward a second workpiece feature alignment target.

54. The method of claim 5, which a single beam modulator causes changes in attenuation state to the UV laser light.

55. The method of claim 39, in which an acousto optic modulator causes changes in attenuation state to the UV laser light.

56. The method of claim 39 further comprising:
causing beam modulation to impart a full attenuation state to the lesser portion of the green laser light to block the transmission of green laser light toward the target in at least one instance when low power UV laser output is directed at the target or at the link.

57. A method for aligning a laser processing beam to a link of an IC device, comprising:
generating first harmonic IR laser light and second harmonic green laser light for propagation thong a first optical path;
splitting the green laser light into a major portion and a lesser portion such that the major portion of the green laser light propagates along the first optical path and such that the lesser portion propagates along a second optical path;
employing a nonlinear crystal positioned along the first optical path to convert green laser light and IR laser light traveling along the first optical path to third harmonic UV laser light;
causing beam modulation to impart a high attenuation state to the UV laser light to provide low power UV laser output;
directing low power UV laser output along the first optical path and through a beam combiner toward a target;
detecting UV light reflected from the target;
causing beam modulation to impart a full attenuation state to the UV laser light to block the transmission of UV laser tight toward the target;
directing the lesser portion of the green laser light along the second optical path and through the beam combiner of the first optical path toward the target;
detecting green light reflected from the target; and
calibrating relative positions of the low power UV laser output and the lesser portion of the green laser light.

58. The method of claim 57 further comprising employing a variable attenuator to cause changes in at attenuation state to the lesser portion of the green laser light.

59. The method of claim 57 which an acousto optic modulator causes changes in attenuation state to the UV laser light.

60. The method of claim 57 further comprising:
causing beam modulation to impart a full attenuation state to the lesser portion of the transmission of green laser light toward the target in at least one instance when low power UV laser output is directed at the target or at the link.

61. The method of claim 57, which the length of nonlinear crystal positioned along the first optical path is greater than or equal to about 3 mm and less than or equal to about 12 mm.

62. The method of claim 61 in which the length of nonlinear crystal positioned along the first optical path is greater than or equal to about 4 mm and less than or equal to about 8 mm.

63. The method of claim 57 further comprising:
passing green laser light or low power UV laser output through an imaged optics module.

64. The of claim 63 in which the image optics module comprises an optical element and an aperture mask.

65. The method of claim 64 in which the optical element comprises a diffractive optics element.

66. The method of claim 65 in which the length of nonlinear crystal positioned along the first optical path is greater than or equal to about 3 mm and less than or equal to about 1 mm.

67. The method of claim 57 further comprising:
directing low power laser output and/or green laser light toward a workpiece feature or alignment target;

detecting UV and/or green laser light reflected from the workpiece feature or alignment target;

aligning an output position of the UV laser light to the link;

causing beam modulation to impart a low attenuation state to the UV laser light to provide high power laser output; and directing a pulse of high power laser output toward the link to sever it.

68. The method of claim 67 in which a single beam modulator causes changes in attenuation state to the UV laser light.

69. The method of claim 67 further comprising employing a variable attenuator to cause changes in at attenuation state to the lesser portion of the green laser light.

70. The method of claim 67 further comprising:

aligning the output position of the UV laser light to a second link; and directing a second pulse of high power laser output toward the second link to sever it before directing low power UV laser output and/or green laser light toward a second workpiece feature alignment target.

71. A method for aligning a laser processing beam to a link of an IC device, comprising:

generating first harmonic IR laser light and second harmonic green laser light for propagation along a first optical path;

splitting the IR laser light into a major portion and a lesser portion such that the major portion of the IR laser light it propagates along the first optical path and such that the lesser portion propagates along a second optical path;

employing a nonlinear crystal positioned along the first optical path to convert green laser light and IR laser light traveling along the first optical path to third harmonic UV laser light;

causing beam modulation to impart a high attenuation state to the UV laser light to provide low power UV laser output;

directing low power UV laser output along the first optical path and through a beam combiner toward a target;

detecting UV light reflected from the target;

causing beam modulation to impart a full attenuation state to the UV laser light to block the transmission of UV laser light toward the target;

directing the lesser portion of the IR laser light along the second optical path and through the beam combiner of the first optical path toward the target;

detecting IR light reflected from the target; and calibrating relative positions of the low power UV laser output and the lesser portion of the IR laser light.

72. The method of claim 71 further comprising employing a variable attenuator to cause changes in at attenuation state to the lesser portion of the IR laser light.

73. The method of claim 71 in which an acousto optic modulator causes changes in attenuation state to the UV laser light.

74. The method of claim 71 further comprising:

causing beam modulation to impart a full attenuation state to the lesser portion of the IR laser light to block the transmission of IR laser light toward the target in at least one instance when low power UV laser output is directed at the target or at the link.

75. The method of claim 71 in which the length of nonlinear crystal positioned along the first optical path is greater than or equal to about 3 mm and less than or equal to about 12 mm.

76. The method of claim 75 in which the length of nonlinear crystal positioned along the first optical path is greater than or equal to about 4 mm and less than or equal to about 8 mm.

77. The method of claim 71 further comprising:

passing the IR laser light or the low power UV laser output through an imaged optics module.

78. The method of claim 77 in which the image optics module comprises an optical element and an aperture mask.

79. The method of claim 78 in which the optical element comprises a diffractive optics element.

80. The method of claim 79 in which the length of nonlinear crystal positioned along the first optical path is greater than or equal to about 3 mm and less than or equal to about 12 mm.

81. The method of claim 71 further comprising:

directing low power UV laser output and/or IR laser light toward a workpiece feature or alignment target;

detecting UV and/or IR laser light reflected from the workpiece feature or alignment target;

aligning an output position of the UV laser light to the link;

causing beam modulation to impart a low attenuation state to the UV laser light to provide high power laser output; and directing pulse of high power laser output toward the link to sever it.

82. The method of claim 81 in which a single beam modulator causes changes in attenuation state to the UV laser light.

83. The method of claim 81 in which a single beam modulator causes changes in attenuation state to the UV laser light.

84. The method of claim 81 further comprising employing a variable attenuator to cause changes in attenuation state to the lesser portion of the IR laser light.

85. The method of claim 81 further comprising:

aligning the output position of the UV laser light to a second link; and directing a second pulse of high power laser output toward the second link to sever it before directing low power UV laser output and/or IR laser light toward a second workpiece feature alignment target.

86. A method for aligning a laser processing beam to a link of an IC device, comprising:

generating first harmonic IR laser light and second harmonic green laser light for propagation along a first optical path;

employing a nonlinear crystal positioned along the first optical path to convert green laser light traveling along the first optical path to fourth harmonic UV laser light;

causing beam modulation to impart a high attenuation state to the UV laser light to provide low power UV laser output;

directing low power UV laser output along the first optical path and through a beam combiner toward a target;

detecting UV light reflected from the target;

causing beam modulation to impart a full attenuation state to the UV laser light to block the transmission of UV laser light toward the target;

directing the lesser portion of the IR laser light along a second optical path and through the beam combiner of the first optical path toward the target;

detecting IR light reflected from the target; and calibrating relative positions of the low power UV laser output and the lesser portion of the IR laser light.

87. The method of claim 86 in which the length of nonlinear crystal positioned along the first optical path is greater than or equal to about 3 mm and less than or equal to about 12 mm.

88. The method of claim 87 in which the length of nonlinear crystal positioned along the first optical path is greater than or equal to about 4 mm and less than or equal to about 8 mm.

89. The method of claim 86 further comprising employing a variable attenuator to cause changes in attenuation state to lesser portion of the IR laser light.

90. The method of claim 86 further comprising:

passing the IR laser light or the low power UV laser output through an imaged optics module.

91. The method of claim 90 in which the image optics module comprises an optical element and an aperture mask.

92. The method of claim 91 in which the optical element comprises a diffractive optics element.

93. The method of claim 92 in which the length of nonlinear crystal positioned along the first optical path is greater than or equal to about 3 mm and less than or equal to about 12 mm.

94. The method of claim 83 further comprising:

directing low power UV laser output and/or IR laser light toward a workpiece feature or alignment target;

detecting UV and/or IR laser light reflected from the workpiece feature or alignment target;

aligning an output position of the UV laser light to the link;

causing beam modulation to impart a low attenuation state to the UV laser light to provide high power laser output; and directing a pulse of high power laser output toward the link to sever it.

95. The method of claim 94 further comprising:

aligning the output position of the UV laser light to a second link; and directing a second pulse of high power laser output toward the second link to sever it before directing low power UV laser output and/or IR laser light toward a second workpiece feature or alignment target.

96. The method of claim 94 further comprising employing a variable attenuator to cause changes in attenuation state to the lesser portion of the IR laser light.

97. The method of claim 86 in which an acousto optic modulator causes changes in attenuation state to the UV laser light.

98. The method of claim 86 further comprising:

causing beam modulation to impart a full attenuation state to the lesser portion of the IR laser light to block the transmission of IR laser light toward the target in at least one instance when low power UV laser output is directed at the target or at the link.

* * * * *

UNITED STATES PATENT AND TRADEMARK OFFICE
CERTIFICATE OF CORRECTION

PATENT NO. : 6,593,542 B2
DATED : July 15, 2003
INVENTOR(S) : Brian W. Baird, Brady E. Nilsen and Ho Wai Lo It is certified that error appears in the above-identified patent and that said Letters Patent is hereby corrected as shown below:

Column 1,
Line 43, "gold" should read -- gold, --;
Line 67, "A" should read -- Å --.

Column 2,
Line 14, "1.3 $\mu$m." should read -- 1.3 $\mu$m, --.

Column 3,
Line 18, "optical paths" should read -- optical paths, --.

Column 4,
Line 66, "at with a" should read -- with a --.

Column 5,
Line 16, "person" should read -- persons --.

Column 6,
Line 27, "FIHG" should read -- FiHG --.

Column 7,
Line 20, "stitching" should read -- switching --.

Column 9,
Line 33, "104(a)" should read -- 104a --;
Line 36, "attenuates" should read -- attenuators --;
Line 39, "generally" should read -- generically --.

Column 12,
Line 25, insert -- be -- after "then".

Column 16,
Line 60, "grew" should read -- green --;
Line 63, "potion" should read -- portion --;
Line 64, "claim 39," should read -- claim 39 --;
Line 65, "posion" should read -- portion --;

UNITED STATES PATENT AND TRADEMARK OFFICE
CERTIFICATE OF CORRECTION

PATENT NO. : 6,593,542 B2
DATED : July 15, 2003
INVENTOR(S) : Brian W. Baird, Brady E. Nilsen and Ho Wai Lo It is certified that error appears in the above-identified patent and that said Letters Patent is hereby corrected as shown below:

Column 17,
Line 49, "case" should read -- cause -- and "in a" should read -- in --;
Line 50, "he" should read -- the --;
Line 57, insert -- or -- after "feature";
Line 58, "5" should read -- 51 --;
Line 61, "39," should read -- 39 --.

Column 18,
Line 7, "thong" should read -- along --;
Line 26, "tight" should read -- light --;
Line 34, delete "at" after "in";
Line 36, insert -- in -- after "57";
Line 41, insert -- green laser light to block the -- after "portion of the";
Line 45, "57," should read -- 57 in --;
Line 56, insert -- method -- after "The";
Line 63, "1" should read -- 12 --;
Line 65, insert -- UV -- after "power".

Column 19,
Lines 14 and 53, delete "at" after "in";
Line 22, insert -- or -- after "feature";
Line 30, "light it propagates" should read -- light propagates --.

Column 20,
Line 28, insert -- a -- after "directing";
Line 45, insert -- or -- after "feature".

Signed and Sealed this

Twenty-sixth Day of October, 2004

JON W. DUDAS
*Director of the United States Patent and Trademark Office*